US011414753B2

(12) United States Patent
Hane et al.

(10) Patent No.: US 11,414,753 B2
(45) Date of Patent: Aug. 16, 2022

(54) PROCESSING METHOD

(71) Applicant: Tokyo Electron Limited, Tokyo (JP)

(72) Inventors: Hideomi Hane, Yamanashi (JP);
Takeshi Oyama, Yamanashi (JP);
Kentaro Oshimo, Yamanashi (JP);
Yusuke Suzuki, Yamanashi (JP); Jun Ogawa, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/086,634

(22) Filed: Nov. 2, 2020

(65) Prior Publication Data

US 2021/0130950 A1 May 6, 2021

(30) Foreign Application Priority Data

Nov. 6, 2019 (JP) .............................. JP2019-201376

(51) Int. Cl.
*H01J 37/32* (2006.01)
*C23C 16/44* (2006.01)
*C23C 16/455* (2006.01)
*C23C 16/511* (2006.01)
*B08B 9/00* (2006.01)

(52) U.S. Cl.
CPC ...... *C23C 16/4408* (2013.01); *C23C 16/4405* (2013.01); *C23C 16/45557* (2013.01); *C23C 16/511* (2013.01); *H01J 37/32862* (2013.01); *B08B 9/00* (2013.01); *H01J 37/32798* (2013.01); *H01J 37/32816* (2013.01)

(58) Field of Classification Search
CPC ............ C23C 16/4408; C23C 16/4405; C23C 16/45557; C23C 16/511; C23C 16/45544; C23C 16/45565; C23C 16/4584; C23C 16/45574; C23C 16/45536; H01J 37/32862; H01J 37/32798; H01J 37/32816; H01J 37/3222; B08B 9/00; H01L 21/68764; H01L 21/68771
See application file for complete search history.

(56) References Cited

U.S. PATENT DOCUMENTS

| 5,788,799 A * | 8/1998 | Steger ............... H01J 37/32357 156/345.37 |
| 2005/0022740 A1* | 2/2005 | Hatano ............... C23C 16/5096 118/723 E |
| 2007/0163617 A1* | 7/2007 | Ozaki ................... B08B 7/0035 134/1.1 |
| 2011/0086517 A1* | 4/2011 | Honda ................ H01L 21/0217 438/792 |
| 2014/0083451 A1* | 3/2014 | Yin .................... H01J 37/32862 134/1.1 |

FOREIGN PATENT DOCUMENTS

JP 2016-115814 6/2016

* cited by examiner

*Primary Examiner* — Erin F Bergner
(74) *Attorney, Agent, or Firm* — IPUSA, PLLC

(57) ABSTRACT

A processing method according to one aspect of the present disclosure includes varying pressure of a processing chamber in a state in which a plasma of a purge gas is formed in the processing chamber, the varying including removing a film deposited in the processing chamber, with the formed plasma.

13 Claims, 12 Drawing Sheets

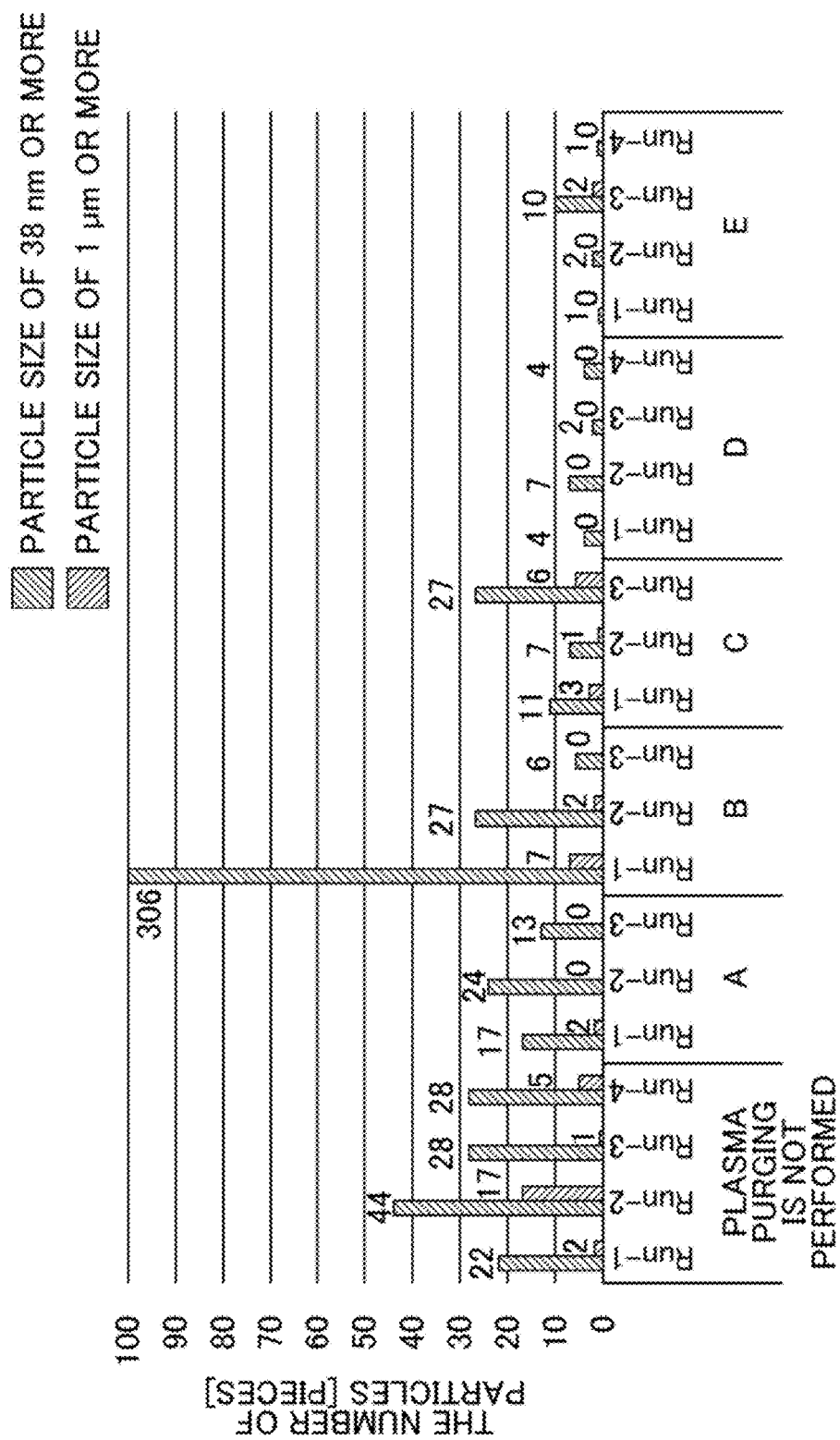

PROCESSING METHOD

CROSS-REFERENCE TO RELATED APPLICATION

This patent application claims priority to Japanese Patent Application No. 2019-201376, filed Nov. 6, 2019, the entire contents of which are incorporated herein by reference in their entirety.

TECHNICAL FIELD

The present disclosure relates to a processing method.

BACKGROUND

An automatic layer deposition (ALD) apparatus is known to use a plasma formed from microwaves (see, for example, Japanese Unexamined Patent Application Publication No. 2016-115814, which is referred to as Patent document 1).

The present disclosure provides a technique that can prevent particles from being generated in a deposition process.

SUMMARY

A processing process according to one aspect of the present disclosure includes varying pressure of a processing chamber in a state in which a plasma of a purge gas is formed in the processing chamber, the varying including removing a film deposited in the processing chamber, with the formed plasma.

BRIEF DESCRIPTION OF THE DRAWINGS

FIG. 12 is a diagram illustrating another example of the evaluation results for the number of particles.

DETAILED DESCRIPTION

Figure 1:
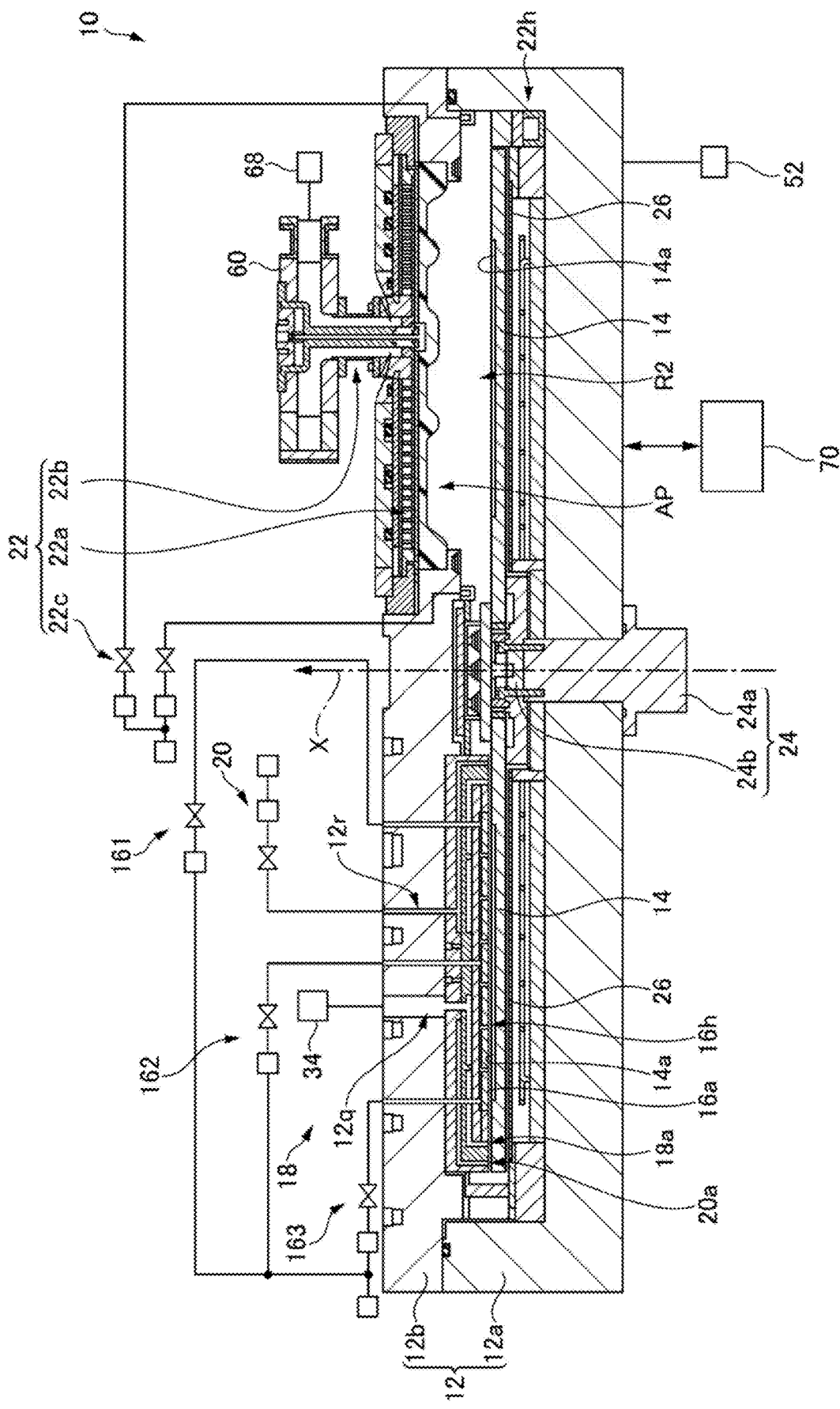
FIG. 1 is a cross-sectional view illustrating an example of a deposition apparatus.

One or more embodiments of the present disclosure, which are not limiting, will be hereinafter described with reference to the drawings. In each drawing, the same or corresponding reference numerals are denoted by the same or corresponding members or components; accordingly, duplicative explanations for the members or components will be omitted.

[Deposition Apparatus]

Figure 2:
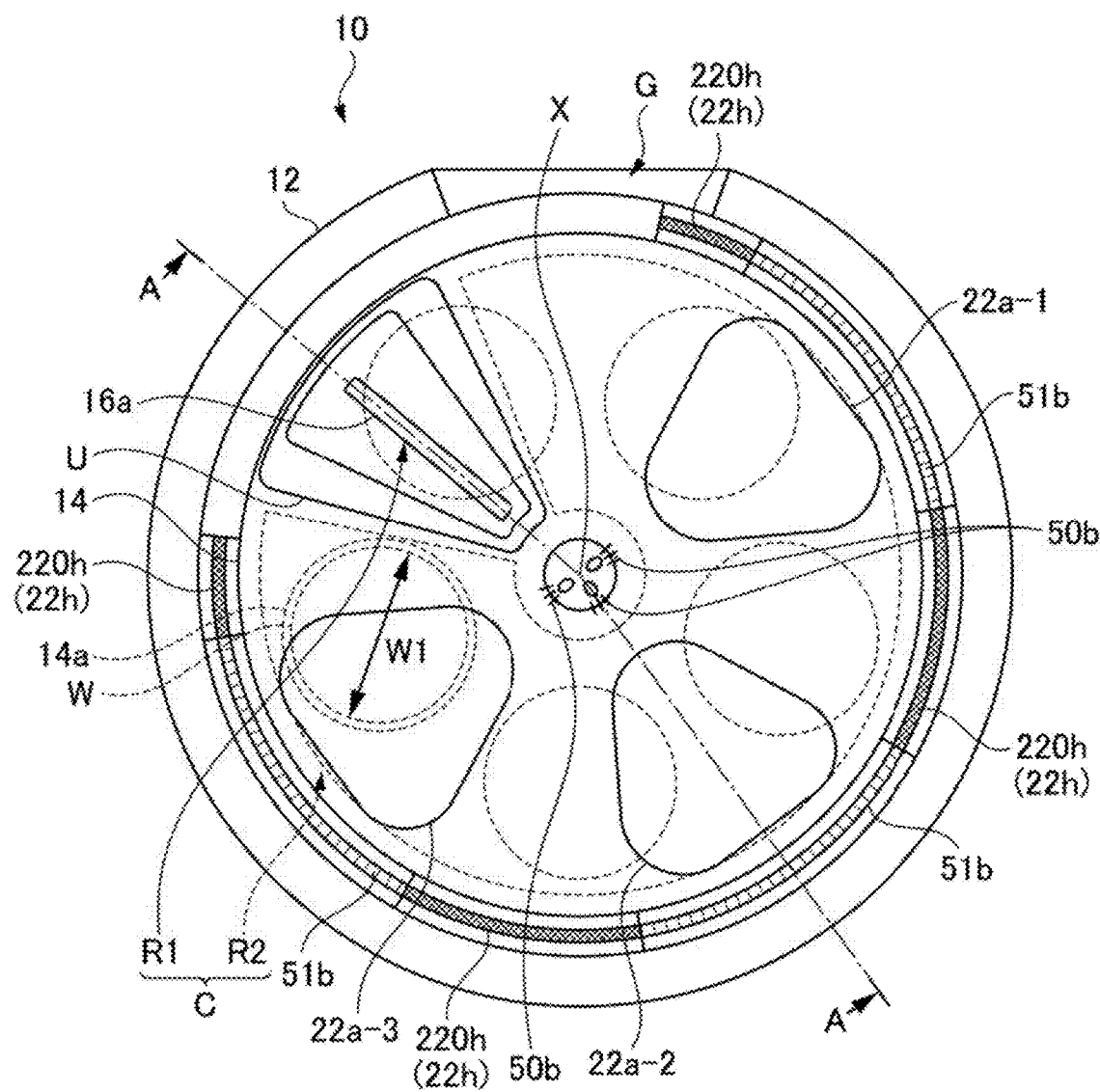
FIG. 2 is a top view illustrating an example of the deposition apparatus in FIG. 1.
Figure 3:
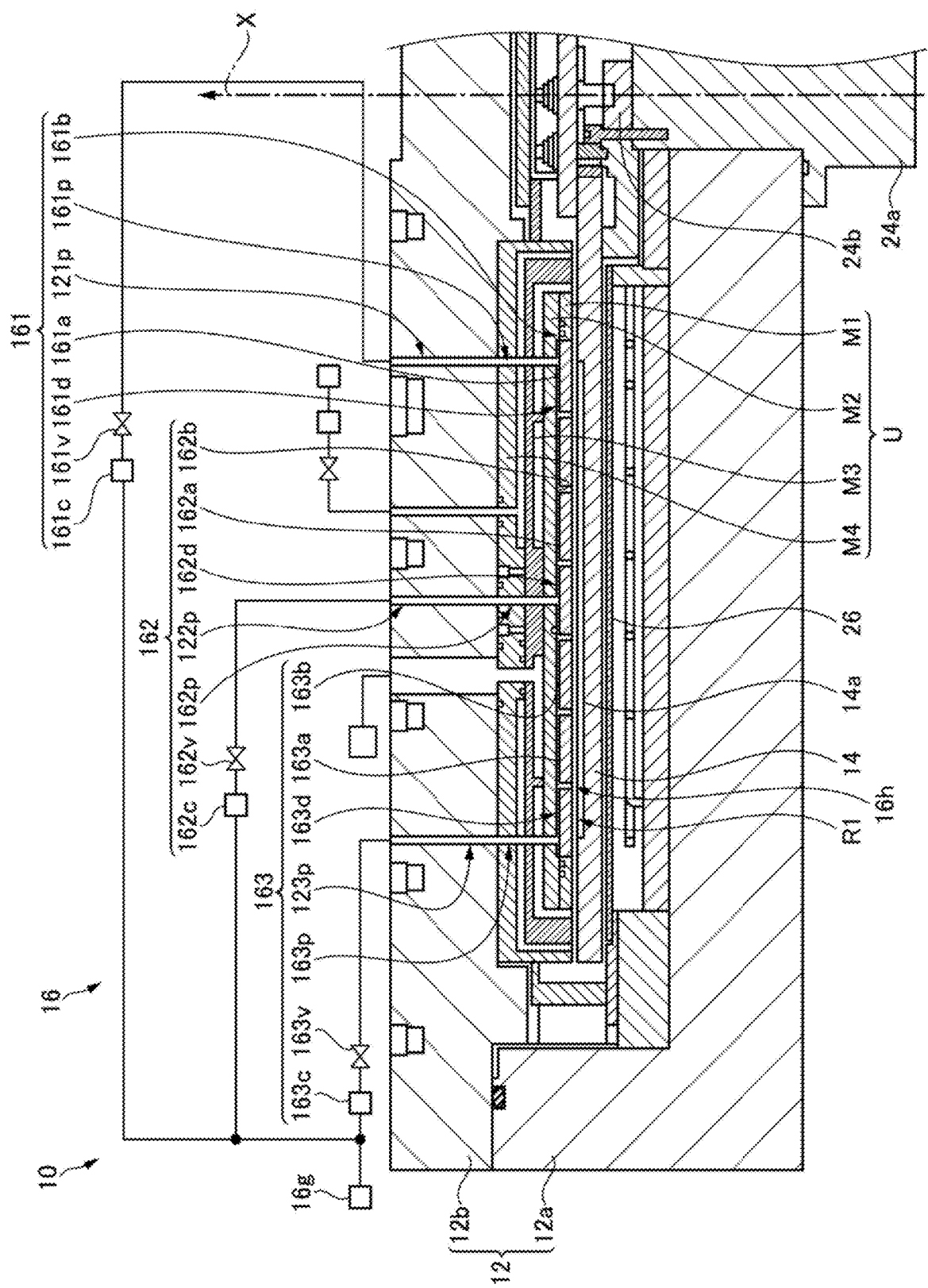
FIG. 3 is an enlarged view illustrating an example of a left-side portion with respect to an axis X in FIG. 1.
Figure 4:
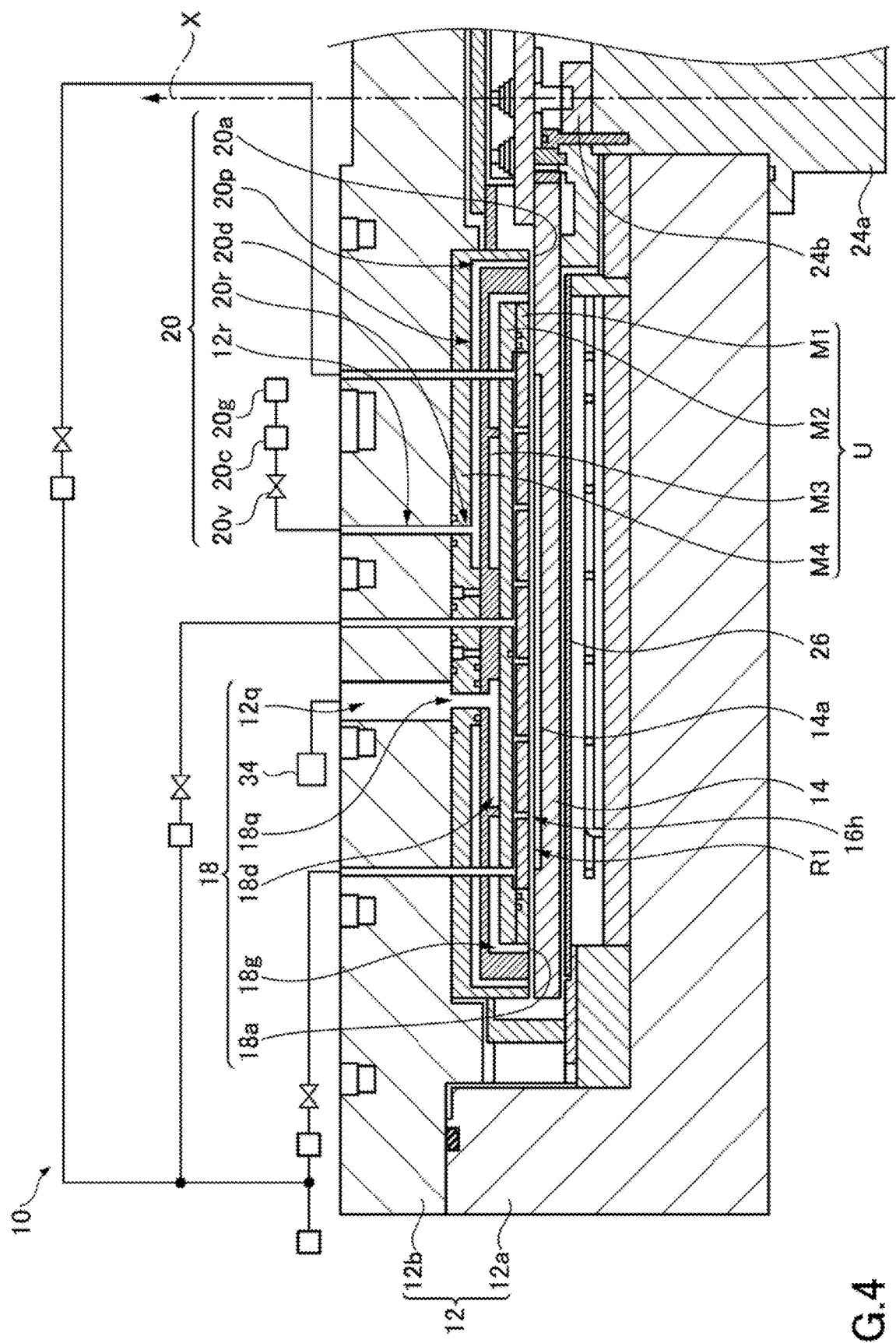
FIG. 4 is an enlarged view illustrating an example of the left-side portion with respect to the axis X in FIG. 1.
Figure 5:
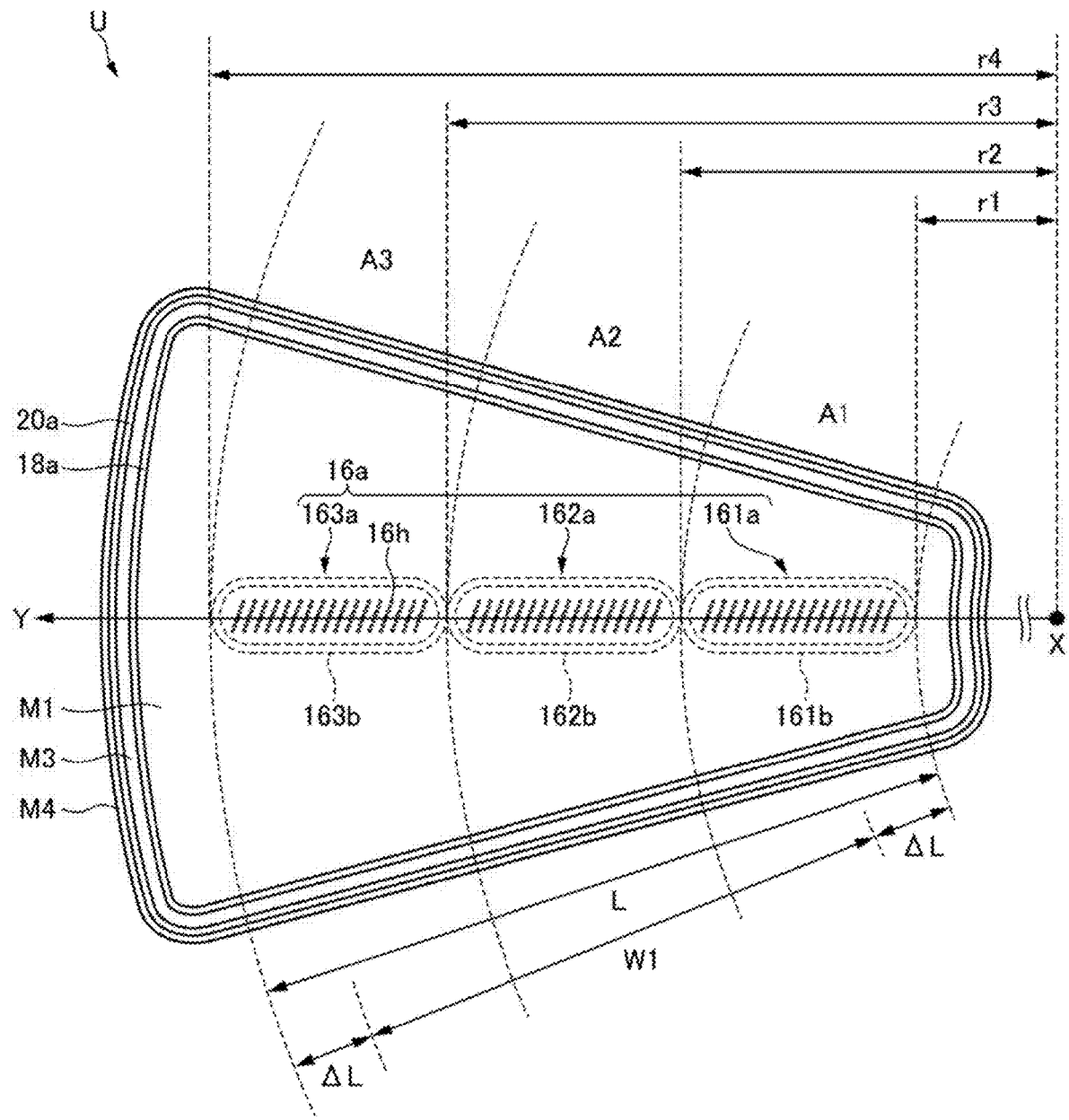
FIG. 5 is a diagram illustrating an example of a lower surface of a unit.
Figure 6:
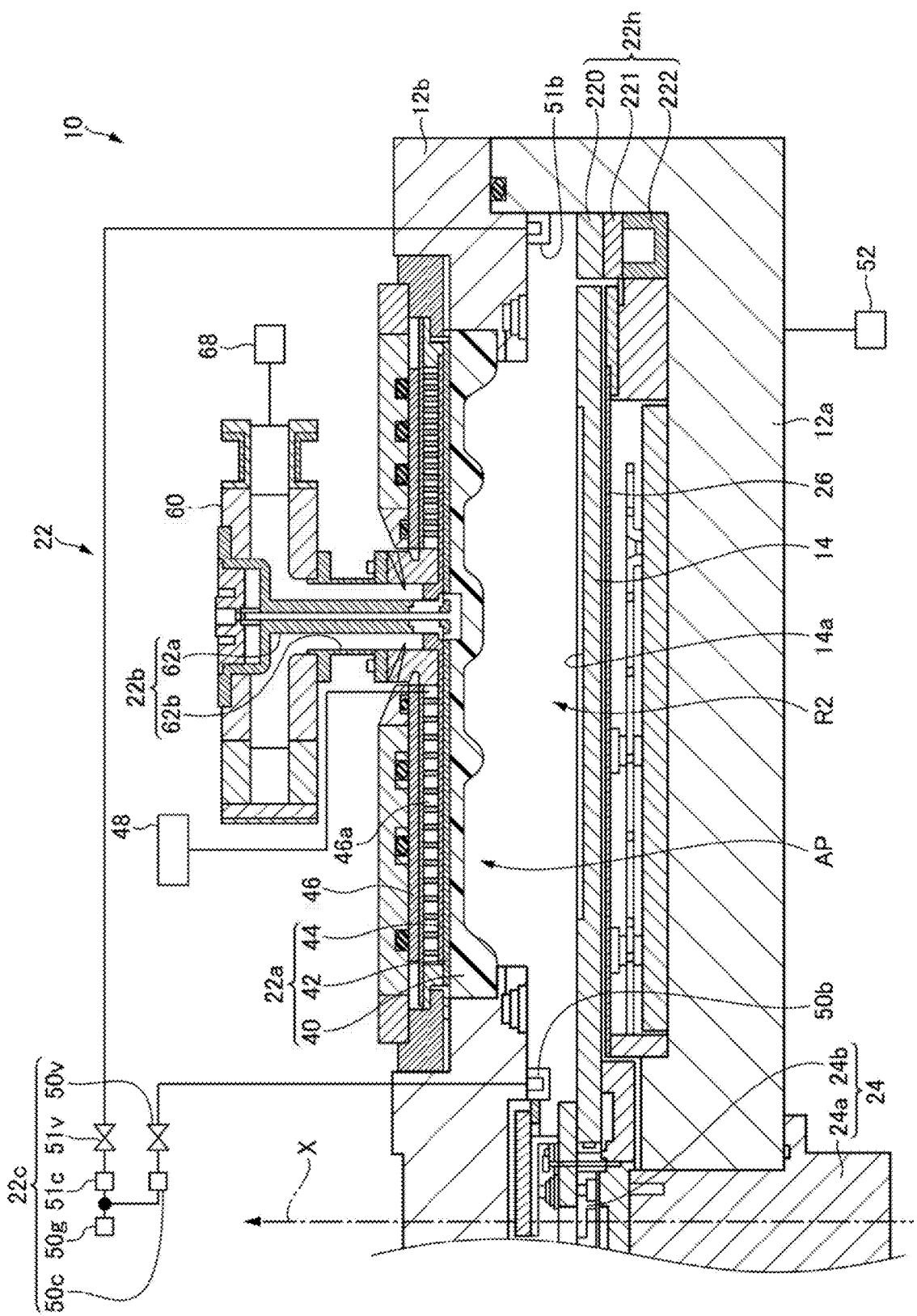
FIG. 6 is an enlarged view illustrating an example of a right-side portion with respect to the axis X in FIG. 1.

FIG. 1 is a cross-sectional view illustrating an example of a deposition apparatus 10. FIG. 2 is a schematic diagram illustrating an example of the deposition apparatus 10 when viewed from the upper side of the deposition apparatus. A cross section of the deposition apparatus taken along the A-A in FIG. 2 is illustrated by FIG. 1. FIGS. 3 and 4 are enlarged cross-sectional views illustrating an example of a left-side portion with respect to an axis X in FIG. 1. FIG. 5 is a diagram illustrating an example of a lower surface of a unit U. FIG. 6 is an enlarged cross-sectional view illustrating an example of a right-side portion with respect to the axis X in FIG. 1. The deposition apparatus 10 illustrated in FIGS. 1 to 6 mainly includes a processing chamber 12, a stage 14, a first gas supply 16, exhaust portions 18, a second gas supply 20, and plasma generators 22.

As illustrated in FIG. 1, the processing chamber 12 includes a lower member 12a and an upper member 12b. The lower member 12a has an approximately cylindrical shape of which the upper side is open, and includes a recessed portion including a sidewall and a bottom wall, which constitute part of a processing chamber C. The upper member 12b is a cover having an approximately cylindrical shape. The upper member 12b covers an upper opening of the recessed portion of the lower member 12a. In such a configuration, the processing chamber C is formed. An elastic sealing member such as an O-ring for sealing the processing chamber C is provided in the outer periphery of a portion between the lower member 12a and the upper member 12b.

The deposition apparatus 10 includes the stage 14 in the processing chamber C that is formed in the processing chamber 12. The stage 14 is rotatably driven about the axis X, by a drive mechanism 24. The drive mechanism 24 includes a drive device 24a such as a motor, and includes a rotation shaft 24b. The drive mechanism 24 is attached to the lower member 12a of the processing chamber 12.

The rotation shaft 24b, of which a central axis is the axis X, extends into an interior of the processing chamber C. The rotation shaft 24b rotates about the axis X, in accordance with a drive force that is transferred by the drive device 24a. A central portion of the stage 14 is supported by the rotation shaft 24b. Thereby, the stage 14 rotates about the axis X, in accordance with the rotation of the rotation shaft 24b. Note that the elastic sealing member such as an O-ring, which seals the processing chamber C, is provided between the lower member 12a of the processing chamber 12 and the drive mechanism 24.

The deposition apparatus 10 includes a heater 26 for heating a substrate W that is mounted on the stage 14, and the heater 26 is below the stage 14 in the processing chamber C. Specifically, the heater 26 heats the substrate W by heating the stage 14. The substrate W may be a semiconductor wafer such as a silicon wafer.

The processing chamber 12 is an approximately cylindrical chamber of which a central axis is the axis X, as illustrated in the example in FIG. 2. The processing chamber C is provided in the interior of the processing chamber 12. A unit U including an injector portion 16a is provided in the processing chamber C. The processing chamber 12 may be formed of a metal such as Al (aluminum), where plasma resistant treatment, such as anodizing or thermal spraying using $Y_2O_3$ (yttrium oxide) is applied to an inner surface of the metal. The deposition apparatus 10 includes the multiple plasma generators 22 in the processing chamber 12.

Each plasma generator 22 includes multiple antennas 22a-1 to 22a-3 for outputting microwaves, and each antenna is disposed on the upper portion of the processing chamber 12. In the present embodiment, an outer profile of each antenna 22a is formed in an approximately triangular shape of which corners are rounded. In FIG. 2, the three antennas 22a-1 to 22a-3 are provided on the upper portion of the processing chamber 12. However, the number of antennas 22a is not limited to the above example, and may be two or less, or four or more.

As illustrated in the example in FIG. 2, the deposition apparatus 10 includes the stage 14 of which the upper surface includes a plurality of substrate mounting regions 14a. The stage 14 is an approximately disc-shaped member of which a central axis is the axis X. The plurality of substrate mounting regions 14a (in the example in FIG. 2, 5 regions) in each of which a given substrate W is to be mounted, are formed in the upper surface of the stage 14, such that the substrate mounting regions are arranged in a concentric pattern of which the center is the axis X. The substrate W is disposed in a given substrate mounting region 14a. When the stage 14 rotates, the substrate W is supported in the substrate mounting region 14a, such that the substrate W is not displaced. In each substrate mounting region 14a, a recessed portion is formed to have an approximately circular shape, which is substantially the same as the approximately circular shape of the substrate W. The diameter of the recessed portion in each substrate mounting region 14a is approximately the same as a diameter W1 of the substrate W to be mounted in the substrate mounting region 14a. In this case, in a diametrical direction of the recessed portion in each substrate mounting region 14a, the substrate W to be mounted is fitted to the recessed portion. Thus, even when the stage 14 rotates, the substrate W is secured so as to not move from a position where the substrate W is secured due to a centrifugal force. When such a state of the substrate W being secured is maintained, any substrate W diameter may be accommodated, in accordance with a recessed portion diameter corresponding thereto.

The deposition apparatus 10 includes a gate valve G in the outer periphery of the processing chamber 12. The gate valve G is used when the substrate W is transferred to the processing chamber C through a transfer device such as a robotic arm. Further, the gate valve G is used when the substrate W is transferred from the processing chamber C. The deposition apparatus 10 includes the exhaust portions 22h at locations corresponding to an edge of the stage 14, below the outer periphery of the stage 14. An exhauster 52 is connected to each exhaust portion 22h. The deposition apparatus 10 controls the operation of the exhauster 52, and exhausts gases in the processing chamber C, through exhaust holes. In such a configuration, the deposition apparatus 10 maintains the pressure of the processing chamber C at a target pressure.

The processing chamber C includes a first region R1 and a second region R2 that are arranged on the circumference of a circle that is centered on the axis X, as illustrated in the example in FIG. 2. The substrate W mounted in a given substrate mounting region 14a passes through the first region R1 and the second region R2 in sequence, in accordance with the rotation of the stage 14. In the present embodiment, the stage 14 illustrated in FIG. 2 rotates in, for example, a clockwise direction when viewed from the upper side of the stage.

The first gas supply 16 includes an inner gas supply 161, a middle gas supply 162, and an outer gas supply 163, as illustrated in the examples in FIGS. 3 and 4. As illustrated in the examples in FIGS. 3 and 4, the unit U that allows the supplying, purging, and exhausting of gases is provided above the first region R1, so as to face the upper surface of the stage 14. The unit U has a structure in which a first member M1, a second member M2, a third member M3, and a fourth member M4 are sequentially stacked. The unit U is attached to the processing chamber 12 so as to contact the lower surface of the upper member 12b of the processing chamber 12.

The unit U includes a gas passage 161p, a gas passage 162p, and a gas passage 163p, each of which is provided through the second member M2 to the fourth member M4, as illustrated in the examples in FIGS. 3 and 4. The gas passage 161p is connected to a gas passage 121p of which an upper end is provided at the upper member 12b of the processing chamber 12. A gas source 16g of a precursor gas is connected to the gas passage 121p via a valve 161v and a flow rate controller 161c such as a mass flow controller. A lower end of the gas passage 161p is formed between the first member M1 and the second member M2, and is connected to a buffer space 161d that is surrounded by an elastic member 161b such as an O-ring. Each injection port 16h of an inner injector 161a that is provided in the first member M1 is connected to the buffer space 161d.

The gas passage 162p is connected to a gas passage 122p of which an upper end is provided at the upper member 12b of the processing chamber 12. The gas source 16g is connected to the gas passage 122p via a valve 162v and a flow rate controller 162c. A lower end of the gas passage 162p is formed between the first member M1 and the second member M2, and is connected to a buffer space 162d that is surrounded by an elastic member 162b such as an O-ring. Each injection port 16h of the middle injector 162a that is provided in the first member M1 is connected to the buffer space 162d.

The gas passage 163p is connected to a gas passage 123p of which an upper end is provided at the upper member 12b of the processing chamber 12. The gas source 16g is connected to the gas passage 123p via a valve 163v and a flow rate controller 16c. A lower end of the gas passage 163p is formed between the first member M1 and the second member M2, and is connected to a buffer space 163d that is surrounded by an elastic member 163b such as an O-ring. Each injection port 16h of the outer injector 163a that is provided in the first member M1 is connected to the buffer space 163d.

The buffer space 161d of the inner gas supply 161, the buffer space 162d of the middle gas supply 162, and the buffer space 163d of the outer gas supply 163, provide separate spaces, as illustrated in the example of FIGS. 3 and 4. Respective flow rates of precursor gases, each of which passes through a given buffer space, are independently controlled by the flow rate controller 161c, the flow rate controller 162c, and the flow rate controller 16c.

In the unit U, a gas passage 20r passing through the fourth member M4 is formed as illustrated in the examples in FIGS. 3 and 4. The gas passage 20r is connected to a gas passage 12r of which an upper end is provided at the upper member 12b of the processing chamber 12. A gas source 20g of a purge gas is connected to the gas passage 12r via a valve 20v and a flow rate controller 20c.

A lower end of the gas passage 20r is connected to a space 20d that is provided between a lower surface of the fourth member M4 and an upper surface of the third member M3.

The fourth member M4 includes a recessed portion that accommodates the first member M1 to the third member M3. A gap 20p is provided between an inner surface of the fourth member M4, which constitutes part of the recessed portion, and an outer surface of the third member M3. The gap 20p is communicated with a space 20d. A lower end of the gap 20p serves as an injection port 20a.

In the unit U, an exhaust path 18q that passes through the third member M3 and the fourth member M4 is formed as illustrated in the examples of FIGS. 3 and 4. The exhaust path 18q is connected to an exhaust path 12q of which an upper end is provided at the upper member 12b of the processing chamber 12. The exhaust path 12q is connected to the exhauster 34 such as a vacuum pump. Further, a lower end of the exhaust path 18q is connected to a space 18d that is provided between the lower surface of the third member M3 and the upper surface of the second member M2.

The third member M3 includes a recessed portion that accommodates the first member M1 and the second member M2. A gap 18g is provided between an inner surface of the third member M3, which constitutes part of the recessed portion provided in the third member M3, and an outer surface of each of the first member M1 and the second member M2. A space 18d is connected to the gap 18g. A lower end of the gap 18g serves as an exhaust port 18a.

At a lower surface of the unit U, i.e., a unit surface facing the stage 14, an injector portion 16a is provided along a Y-axis direction that is a direction away from the axis X, as illustrated in the example of in FIG. 5. A region facing the injector portion 16a, within the region included in the processing chamber C, is the first region R1. The injector portion 16a injects a precursor gas onto the substrate W that is mounted on the stage 14. The injector portion includes an inner injector 161a, a middle injector 162a, and an outer injector 163a, as illustrated in the example of FIG. 5.

As illustrated in the example of FIG. 5, the inner injector 161a is formed in an inner annular region A1 that is a region included in the lower surface of the unit U. Where, the region is within an annular region corresponding to a distance from the axis X that is in the range of r1 to r2. The middle injector 162a is formed in an inner annular region A2 that is a region included in the lower surface of the unit U. Where, the region is within an annular region corresponding to a distance from the axis X that is in the range of r2 to r3. The outer injector 163a is formed in an inner annular region A3 that is a region included in the lower surface of the unit U. Where, the region is within an annular region corresponding to a distance from the axis X that is in the range of r3 to r4.

As illustrated in the example of FIG. 5, a length L from r1 to r4, which is in a range in which the injector portion extends in the Y-axis direction, is longer than a length of the substrate W with the diameter W1 when crossing with respect to the Y-axis direction by at least a predetermined distance ΔL in a direction towards the X-axis and by at least the predetermined distance ΔL in the opposite direction.

The inner injector 161a, the middle injector 162a, and the outer injector 163a each include multiple injection ports 16h, as illustrated in the example of FIG. 5. The precursor gas is injected from each injection port 16h toward the first region R1. The respective flow rates of the precursor gases, which are injected toward the first region R1 via the injection ports 16h of a given injector, from among the inner injector 161a, the middle injector 162a, and the outer injector 163a, are independently controlled by the flow rate controller 161c, the flow rate controller 162c, and the flow rate controller 16c. The precursor gas is supplied to the first region R1, and thus atoms or molecules of the precursor gas that passes through the first region R1 are adsorbed onto the surface of the substrate W. The precursor gas can be a gas containing a molecule with a Si—Cl bond. For example, as the gas containing the molecule with the Si—Cl bond, gas such as DCS (dichlorosilane), monochlorosilane, trichlorosilane, hexachlorodisilane, silicon tetrachloride, or the like, can be used. As other precursor gas, a silicon containing gas, such as $SiH_4$ (silane) gas, can be used.

The exhaust port 18a of the exhaust portion 18 is provided above the first region R1 to face the upper surface of the stage 14, as illustrated in the examples of FIGS. 3 and 4. The exhaust port 18a is formed at the lower surface of the unit U, so as to surround the peripheries of the injector portion 16a, as illustrated in the example of FIG. 5. The exhaust port 18a allows gases in the processing chamber C to be exhausted in accordance with the operation of the exhauster 34 such as a vacuum pump.

The injection port 20a of the second gas supply 20 is provided above the first region R1 to face the upper surface of the stage 14, as illustrated in the examples in FIGS. 3 and 4. The injection port 20a is formed at the lower surface of the unit U to surround the periphery of the exhaust port 18a, as illustrated in the example of FIG. 5. The second gas supply 20 allows the purge gas to be injected toward the first region R1. The purge gas injected through the second gas supply 20 is an inert gas such as Ar (argon). The purge gas is injected onto the surface of the substrate W and thus atoms or molecules (residual gas components) of the precursor gas that are excessively adsorbed onto the substrate W, are removed from the substrate W. Thereby, an atomic layer or a molecular layer onto which the atoms or molecules of the precursor gas are adsorbed, is formed on the surface of the substrate W.

In the unit U, the purge gas is injected from the injection port 20a, and the purge gas is exhausted via the exhaust port 18a, along a given surface of the stage 14. Thereby, the unit U prevents the precursor gas supplied to the first region R1, from leaking out to a region other than the first region R1. Further, in the unit U, the purge gas is injected from the injection port 20a and the purge gas is exhausted via the exhaust port 18a, along the surface of the stage 14. Thereby, the unit U prevents the reacting gas supplied to the second region R2, a radical of the reacting gas, or the like, from entering the first region R1. As described above, in the unit U, the first region R1 and the second region R2 are separated, where the purge gas is injected from the second gas supply 20 and the purge gas is exhausted via the exhaust portion 18.

As illustrated in the example of FIG. 6, the deposition apparatus 10 includes the plasma generator 22 provided to face the upper surface of the stage 14, and the plasma generator 22 is disposed in an opening AP of the upper member 12b that is above the second region R2. The plasma generator 22 includes an antenna 22a, a coaxial waveguide 22b for supplying microwaves to the antenna 22a, and a reacting gas supply 22c for supplying the reacting gas to the second region R2. In the present embodiment, for example, three openings AP are formed in the upper member 12b, and the deposition apparatus 10 includes, for example, three antennas 22a-1 to 22a-3.

The plasma generator 22 supplies the microwave to the second region R2 via the antenna 22a and the coaxial waveguide 22b, and supplies the reacting gas to the second region R2 from the reacting gas supply 22c. In such a configuration, the plasma generator 22 produces a plasma of the reacting gas in the second region R2. Further, the plasma generator 22 performs plasma processing for the atomic layer or the molecular layer that is adsorbed onto the surface of the substrate W. In the present embodiment, a gas containing a nitrogen atom and a hydrogen atom is used as the reacting gas. The plasma generator 22 causes the atomic layer or molecular layer adsorbed onto the substrate W, to be nitride. As the reacting gas, for example, a gas mixture of $N_2$ (nitrogen) gas and $H_2$ (hydrogen) gas, a gas mixture of $NH_3$ (ammonia) gas and $H_2$ gas, or the like can be used. The reacting gas also serves as a purge gas in the processing method described below.

As illustrated in the example of FIG. 6, in the plasma generator 22, the antenna 22a is disposed in an airtight state such that the opening AP is closed. The antenna 22a includes a top plate 40, a slot plate 42, and a slow wave plate 44. The top plate 40 is an approximately equilateral triangle-shaped member of which corners are rounded, and the member is formed of a dielectric. For example, the top plate 40 is formed of alumina ceramics or the like. The top plate 40 is supported by the upper member 12b such that the lower surface of the top plate is exposed to the second region R2 through the opening AP, which is formed in the upper member 12b of the processing chamber 12.

The slot plate 42 is provided on the upper surface of the top plate 40. The slot plate 42 is a metallic plate member that is formed in an approximately equilateral triangular shape. A plurality of slot pairs are formed in the slot plate 42. Each slot pair has two slot holes that are perpendicular to each other.

The slow wave plate 44 is provided on the upper surface of the slot plate 42. The slow wave plate 44 is formed of a dielectric such as alumina ceramics, and is formed in an approximately equilateral-triangular shape. The slow wave plate 44 has an approximately cylindrical opening for disposing an outer conductor 62b of the coaxial waveguide 22b.

A metallic cooling plate 46 is provided on the upper surface of the slow wave plate 44. The cooling plate 46 cools the antenna 22a via the slow wave plate 44, by using a coolant that flows through a flow path 46a formed in an interior of the cooling plate. The coolant of which temperature is adjusted by a chiller 48 is supplied to the flow path 46a. The coolant may be, for example, fluorinated inert liquid such as Galden (registered trademark). The cooling plate 46 is pressed against the upper surface of the slow wave plate 44, by a spring not illustrated, or the like. Thus, the lower surface of the cooling plate 46 closely adheres to the upper surface of the slow wave plate 44.

The coaxial waveguide 22b includes an inner conductor 62a and an outer conductor 62b. The inner conductor 62a passes, from the upper side of the antenna 22a, through an opening in the slow wave plate 44 and an opening in the slot plate 42. The outer conductor 62b is provided to surround the inner conductor 62a, such that a space is provided between the outer periphery of the inner conductor 62a and the inner periphery of the outer conductor 62b. A lower end of the outer conductor 62b is connected to an opening provided in the cooling plate 46. Note that the antenna 22a may serve as an electrode. Alternatively, an electrode provided in the processing chamber 12 may be used as the antenna 22a.

The deposition apparatus 10 includes a waveguide 60 and a microwave generator 68. For example, microwaves set at about 2.45 GHz, which are generated by the microwave generator 68, propagate, via the waveguide 60, to the coaxial waveguide 22b and then propagate to the space between the inner conductor 62a and the outer conductor 62b. The microwave propagating through the slow wave plate 44 propagates from the slot holes of the slot plate 42 to the top plate 40. Then, the microwave is emitted, from the top plate 40, to the second region R2.

The reacting gas is supplied to the second region R2 from the reacting gas supply 22c. The reacting gas supply 22c includes multiple inner injection ports 50b and multiple outer injection ports 51b, as illustrated in the example of FIG. 2. Each inner injection port 50b is connected to a gas source 50g of the reacting gas, via a valve 50v and a flow rate controller 50c such as a mass flow controller, as illustrated in the example of FIG. 6. Each inner injection port 50b is provided on the lower surface of the upper member 12b of the processing chamber 12, as illustrated in the example of FIG. 6.

Each inner injection port 50b allows the reacting gas, which is supplied, via the valve 50v and the flow rate controller 50c, by the gas source 50g, to be injected in a direction away from the axis X. For example, such a direction is a direction parallel to a given surface of the substrate W that is mounted in the substrate mounting region 14a of the stage 14.

Each outer injection port 51b is connected to the gas source 50g of the reacting gas, via a valve 51v and a flow controller 51c such as a mass flow controller. Each outer injection port 51b is provided on the lower surface of the upper member 12b of the processing chamber 12, as illustrated in the example of FIG. 6. Each outer injection port 51b allows the reacting gas, which is supplied, via the valve 51v and the flow rate controller 51c, by the gas source 50g, to be injected in a direction becoming closer to the axis X. For example, such a direction is a direction parallel to a given surface of the substrate W that is mounted in the substrate mounting region 14a of the stage 14.

In the present embodiment, respective flow rates of the reacting gases each of which is injected from a given injection port, among from the inner injection ports 50b and the outer injection ports 51b, are independently controlled by the flow rate controller 50c and the flow rate controller 51c. The flow rate controller 50c and the flow rate controller 51c may be provided for each antenna 22a. The flow rate of the reacting gases that are injected from given inner injection ports 50b and given outer injection ports 51b, which are provided for each antenna 22a, may be independently controlled for a given antenna 22a.

Each plasma generator 22 allows the reacting gas to be supplied to the second region R2 via the multiple inner injection ports 50b and the multiple outer injection ports 51b. Further, each plasma generator 22 allows the microwave to be supplied to the second region R2 via the antenna 22a. Thus, the plasma generator 22 allows a plasma of the reacting gas to be formed in the second region R2. In this case, in accordance with rotation of the stage 14, the substrate W that is mounted on the stage 14 passes under the plasma of the reacting gas that is formed in the second region R2. In such a configuration, the plasma of the reacting gas containing hydrogen is formed just above the substrate W. Thus, Cl that may enter as an impurity, a nitride film, can be removed with a high-density hydrogen plasma. Accordingly, a film with a decreased impurity component can be formed on the substrate W. Such a film with the decreased impurity component has compressibility.

The exhaust portions 22h are provided in the periphery of the stage 14, as illustrated in the example of FIG. 2. Each exhaust portion 22h includes a groove 222 of which the upper side is open, and includes a cover portion 221 provided on the upper portion of the groove 222, as illustrated in the example of FIG. 6. The groove 222 is connected to the exhauster 52. The cover portion 221 has multiple exhaust holes in a given exhaust region 220h illustrated in the example of FIG. 2.

A spacer 220 is provided on each cover portion 221, below a given outer injection port 51b. The spacer 220 has a thickness that is approximately the same as a height from the upper surface of the cover portion 221 to the upper surface of the stage 14, as illustrated in the example of FIG. 6. Below the outer injection port 51b, the spacer 220 prevents an increase in a gas flow rate, which is caused by a step difference between the stage 14 and the cover portion 221.

In each exhaust region 220h, when the exhauster 52 operates, the exhaust portion 22h allows gases in the processing chamber C to be exhausted, via the groove 222, from the multiple exhaust holes provided in the cover portion 221. Note that for the exhaust holes provided in each cover portion 221, positions, sizes, and number of the holes are adjusted such that exhaust amounts of gases from the respective exhaust regions 220h are approximately identical.

The deposition apparatus 10 includes a controller 70 for controlling each component of the deposition apparatus 10, as illustrated in the example of FIG. 1. The controller 70 may be a computer that includes a controller such as a central processing unit (CPU), a storage device such as a memory, an input and output device, and the like. The controller 70 controls each component of the deposition apparatus 10, when the CPU executes a control program stored in the memory.

The controller 70 transmits a control signal for controlling a rotation speed of the stage 14, to a drive device 24a. The controller 70 also transmits a control signal for adjusting temperature of the substrate W, to a power source that is connected to the heater 26. The controller 70 transmits a control signal for controlling a flow rate of the precursor gas, to a given valve from among the valves 161v to 163v as well as a given flow rate controller from among the flow rate controllers 161c to 16c. Further, the controller 70 transmits, to the exhauster 34, a control signal for controlling an exhaust amount for the exhauster 34, which is connected to each exhaust port 18a.

The controller 70 transmits a control signal for controlling a flow rate of the purge gas, to the valve 20v and the flow rate controller 20c. The controller 70 also transmits a control signal for controlling transmission power of the microwave, to the microwave generator 68. The controller 70 transmits a control signal for controlling a flow rate of the reacting gas, to a given valve from among the valve 50v and the valve 51v, as well as to a given flow rate controller from among the flow rate controller 50c and the flow rate controller 51c. Further, the controller 70 transmits a control signal for controlling an exhaust amount of gas from each exhaust portion 22h, to the exhauster 52.

In the deposition apparatus 10 in such a configuration described above, the precursor gas is injected from the first gas supply 16, onto the substrate W, which is moved in accordance with the rotation of the stage 14. Further, an excessively adsorbed precursor gas is removed from the substrate W, through the second gas supply 20. The substrate W, which is moved in accordance with the rotation of the stage 14, is exposed to the plasma of the reacting gas formed by the plasma generator 22. When the stage 14 rotates, the above operation for the substrate W is repeatedly performed. Thus, the deposition apparatus 10 allows a film having a predetermined thickness to be formed on the substrate W.

<Processing Method>

In a process (hereinafter referred to as a "deposition process") of depositing a film having a predetermined thickness on the substrate W, by the deposition apparatus 10 according to one embodiment, an example of a processing method of removing a deposited film that is deposited on portions of the processing chamber 12 will be described hereafter. For example, the portions of the processing chamber 12 include the lower surface of the top plate 40 of the antenna 22a, and the upper surface of the stage 14.

Figure 7:
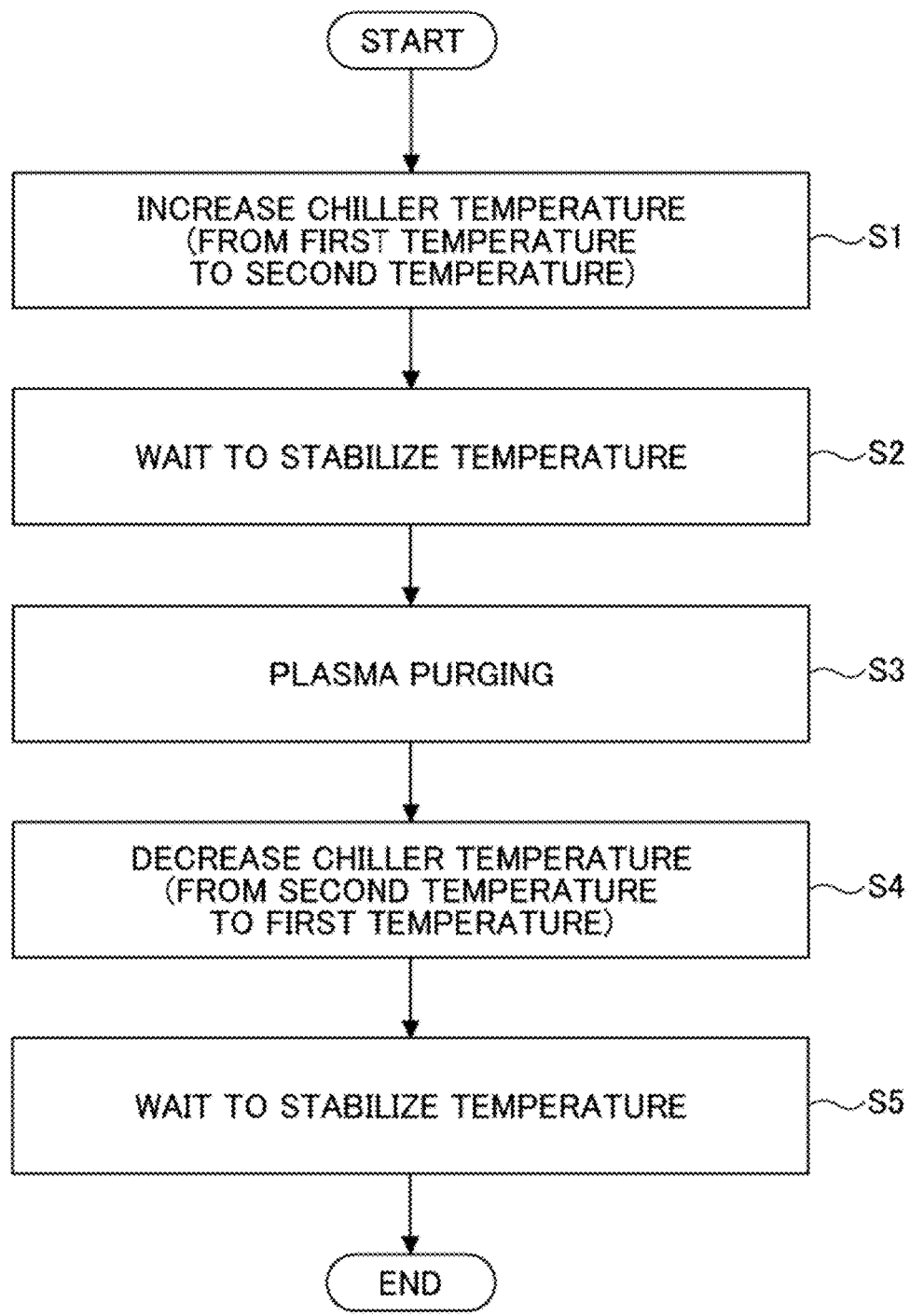
FIG. 7 is a flowchart illustrating an example of a processing method according to one embodiment.

FIG. 7 is a flowchart illustrating an example of the processing method according to one embodiment. For example, the processing method illustrated in FIG. 7 is performed at the deposition apparatus 10 when a total thickness of deposited films that are deposited on respective portions of the processing chamber 12 reaches a predetermined film thickness (e.g., 5 μm). For example, the processing method illustrated in FIG. 7 may be performed in a state in which the substrate W is accommodated in the processing chamber 12, or in a state in which the substrate W is not accommodated in the processing chamber 12. As illustrated in FIG. 7, the processing method according to one embodiment includes steps S1 to S5.

In step S1, the controller 70 changes a target temperature of the chiller 48 from a first temperature to a second temperature. In this case, the temperature of the coolant that flows from the chiller 48 into the flow path 46a, which is formed in the interior of the cooling plate 46, is increased from the first temperature to the second temperature. Thus, the temperature of the top plate 40 of a given antenna 22a increases. For example, the first temperature may be a target temperature set when the deposition process is performed. For example, the first temperature may be between 50° C. and 70° C. The second temperature is higher than the first temperature. For example, the second temperature may be between 70° C. and 90° C.

Step S2 is a step of stabilizing the temperature of the top plate 40 of the antenna 22a. For example, a time period taken in step S1 is between 30 minutes and 70 minutes.

In step S3, the controller 70 causes the purge gas to be supplied from the reacting gas supply 22c, and causes the microwave to be supplied via the antenna 22a. Thus, the plasma of the purge gas is formed in the processing chamber 12, so that the deposited film deposited in the processing chamber 12 is removed with the formed plasma. In the following description, a process of supplying the purge gas from the reacting gas supply 22c, supplying the microwave via the antenna 22a to thereby form the plasma of the purge gas in the processing chamber 12, and removing the deposited film deposited in the processing chamber 12, with the formed plasma, is referred to as plasma purging. By repeatedly performing the plasma purging, the deposited film is formed. Where, the deposited film means a deposit on a given portion of the processing chamber 12, such as the lower surface of the top plate 40 of the antenna 22a, or the upper surface of the stage 14. The plasma purging will be described below in detail. Note that after step S3, the controller 70 may perform cycle purging in which purging and evacuating for the processing chamber 12 are repeatedly performed, without supplying the microwave via the antenna 22a.

In step S4, the controller 70 changes the target temperature of the chiller 48 from the second temperature to the first temperature. In this case, the temperature of the coolant that flows from the chiller 48 into the flow path 46a, which is formed in the interior of the cooling plate 46, is decreased from the second temperature to the first temperature. Thus, the temperature of the top plate 40 of a given antenna 22a decreases.

Step S5 is a step of stabilizing the temperature of the top plate 40 of the antenna 22a. For example, a time period taken in step S5 is between 30 minutes and 70 minutes.

<Plasma Purging>

Figure 8:
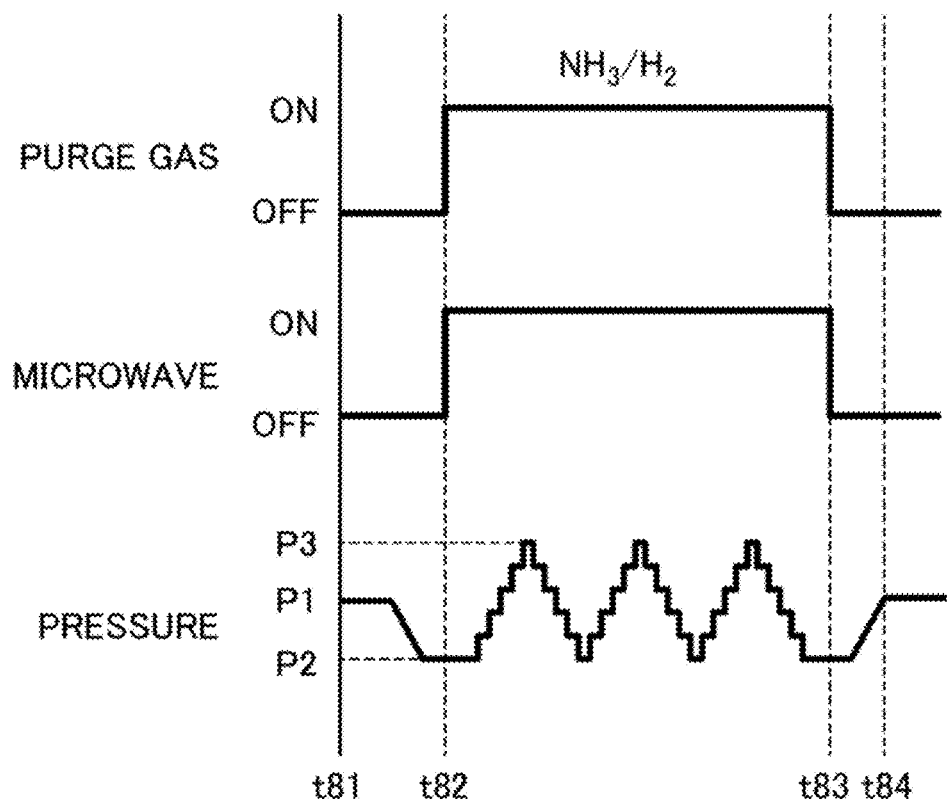
FIG. 8 is a diagram illustrating an example of a sequence of plasma purging.

An example of a sequence of plasma purging in the processing method according to one embodiment will be described hereafter. FIG. 8 is a diagram illustrating an example of the sequence of plasma purging.

In the example of FIG. 8, first, from a time t81 to a time t82, the controller 70 causes pressure of the processing chamber 12 to change from first pressure P1 to second pressure P2, without supplying a gas mixture (hereafter referred to as "$NH_3/H_2$ gas") of $NH_3$ (hydrogen azide) gas and $H_2$ (hydrogen) gas; and the microwave. The $NH_3/H_2$ gas is an example of the purge gas. The second pressure P2 is lower than the first pressure P1. For example, the second pressure P2 may be 0.8 Torr (107 Pa).

Then, at the time t82, the controller 70 causes the $NH_3/H_2$ gas to be supplied from the reacting gas supply 22c to the processing chamber 12, and causes the microwave to be supplied via a given antenna 22a. Thus, a plasma of the $NH_3/H_2$ gas is formed in the processing chamber 12. Note that microwave power may be set at 3 kW, for example.

Then, from the time t82 to a time t83, the controller 70 causes a plurality of cycles, each of which includes a step of increasing the pressure of the processing chamber 12 and a step of decreasing the pressure of the processing chamber 12, to be repeated. During these steps, a state in which the plasma of the $NH_3/H_2$ gas is formed in the processing chamber 12, is maintained. In such a configuration, the deposited film that is deposited in the processing chamber 12 is removed with the formed plasma. Note that the number of cycles may be three, for example.

In the step of increasing the pressure of the processing chamber 12, the pressure of the processing chamber 12 increases in a stepped manner, from second pressure P2 to third pressure P3, as illustrated in the example of FIG. 8. In other words, in the step of increasing the pressure of the processing chamber 12, the pressure of the processing chamber 12 is increased each time a predetermined period of time elapses.

In the step of decreasing the pressure of the processing chamber 12, the pressure of the processing chamber 12 decreases in a stepped manner, from the third pressure P3 to the second pressure P2, as illustrated in the example of FIG. 8. In other words, in the step of decreasing the pressure of the processing chamber 12, the pressure of the processing chamber 12 is decreased each time a predetermined period of time elapses.

Note that in each of the step of increasing the pressure of the processing chamber 12 and the step of decreasing the pressure of the processing chamber 12, the pressure of the processing chamber 12 may be continuously varied. However, the pressure may be preferably varied in a stepped manner, from the viewpoint of stabilizing plasma discharge. The third pressure P3 is higher than the second pressure P2. For example, the third pressure P3 may be 3.0 Torr (400 Pa). The time period from the time t82 to the time t83 is set in accordance with a thickness of the deposited film that is deposited in the processing chamber 12. For example, such a time period may be between 90 minutes and 150 minutes.

Then, at the time t83, the controller 70 interrupts the supply of the $NH_3/H_2$ gas from the reacting gas supply 22c to the processing chamber 12, and interrupts the supply of the microwave via the antenna 22a.

Then, from the time t83 to a time t84, the controller 70 causes the pressure of the processing chamber 12 to change from the second pressure P2 to the first pressure P1, without supplying the $NH_3/H_2$ gas and the microwave.

In the plasma purging illustrated in FIG. 8, the controller 70 causes the deposited film, which is deposited in the processing chamber 12, to be removed with the plasma formed from the microwave. In such a configuration, with use of the plasma of the $NH_3/H_2$ gas, the deposited film deposited in the processing chamber 12 can be purged and removed.

Further, in the plasma purging illustrated in FIG. 8, the controller 70 repeats the multiple cycles each of which includes the step of increasing the pressure of the processing chamber 12 and the step of decreasing the pressure of the processing chamber 12. While in these steps, the plasma of the $NH_3/H_2$ is formed in the processing chamber 12. In such a configuration, while the plasma purging is performed, an in-plane distribution of emission intensity from the plasma of the $NH_3/H_2$ gas can be varied below the top plate 40 of the antenna 22a. For this reason, the deposition film deposited on the lower surface of the top plate 40 of the antenna 22a can be prevented from remaining in part of a lower surface area of the top plate 40. As a result, generation of particles can be prevented in the deposition process.

Figure 9:
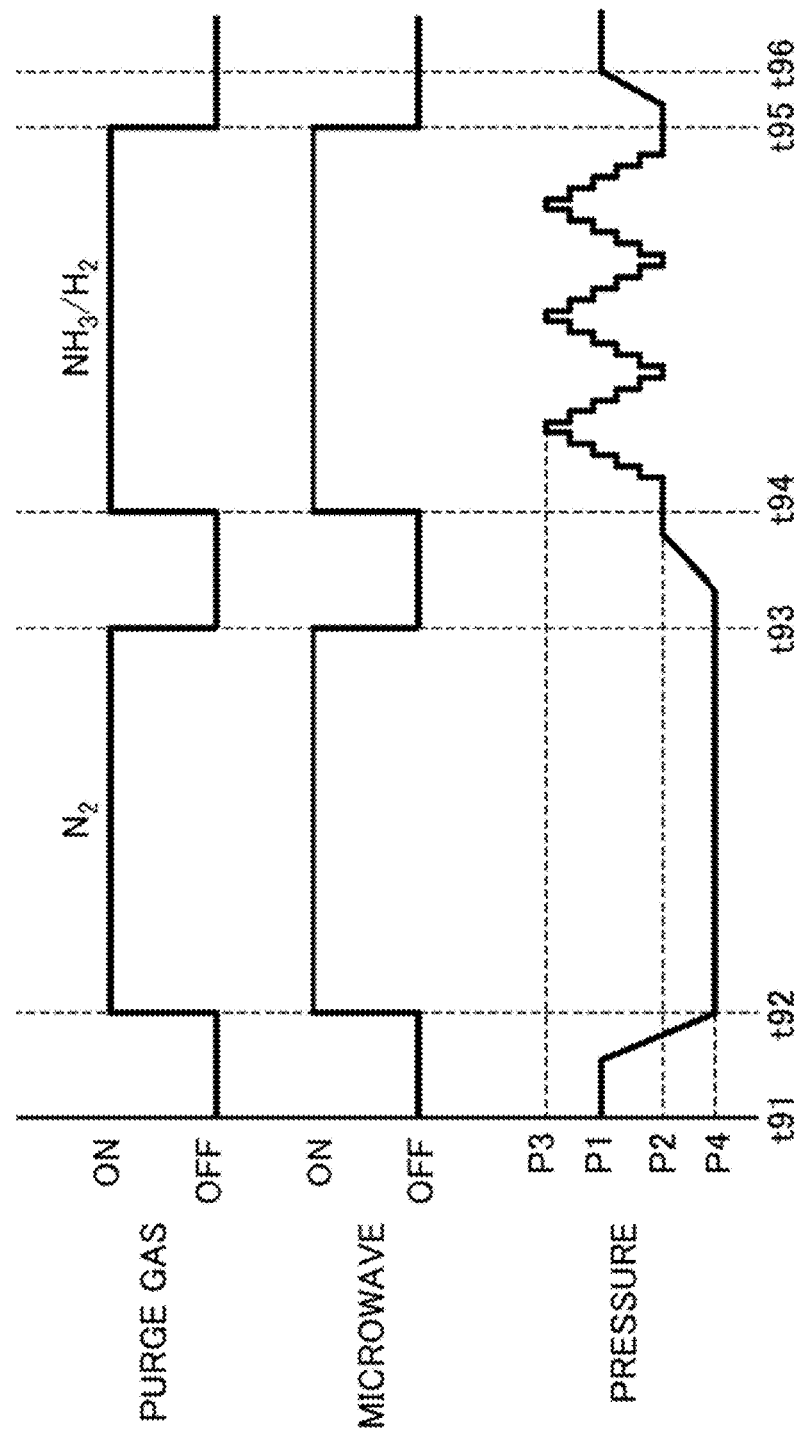
FIG. 9 is a diagram illustrating another example of the sequence of plasma purging.

Another example of the sequence of plasma purging in the processing method according to one embodiment will be described hereafter. FIG. 9 illustrates another example of the sequence of plasma purging.

In the example of FIG. 9, first, from a time t91 to a time t92, the controller 70 causes the pressure of the processing chamber 12 to change from first pressure P1 to fourth pressure P4, without supplying $NH_3/H_2$ gas, $N_2$ gas, and microwaves. The $NH_3/H_2$ gas is an example of the purge gas, and the $N_2$ gas is an example of a second purge gas. The fourth pressure P4 is lower than second pressure P2, which indicates a minimum value for pressure of the processing chamber 12 when the multiple cycles, each of which includes a step of increasing the pressure of the processing chamber 12 and a step of decreasing the pressure of the processing chamber 12, is repeated as described below. For example, the fourth pressure P4 may be 0.4 Torr (53 Pa).

Then, at the time t92, the controller 70 causes the $N_2$ gas to be supplied from the reacting gas supply 22c to the processing chamber 12, and causes the microwave to be supplied via a given antenna 22a. Thus, a plasma of the $H_2$ gas is formed in the processing chamber 12. Note that microwave power may be set at 3 kW, for example.

Then, from the time t92 to a time t93, the controller 70 causes the pressure of the processing chamber 12 to be constantly maintained in a state in which a plasma of the $N_2$ gas is formed in the processing chamber 12. In such a configuration, the deposited film deposited in the processing chamber 12 is removed with the formed plasma. A time period from the time t92 to the time t93 may be set in accordance with a thickness of the deposited film deposited in the processing chamber 12. Such a time period may be between 30 minutes and 90 minutes, for example.

Then, at the time t93, the controller 70 interrupts the supply of the $N_2$ gas from the reacting gas supply 22c to the processing chamber 12, and interrupts the supply of the microwave via the antenna 22a.

Then, from the time t93 to a time t94, the controller 70 causes the pressure of the processing chamber 12 to change from the fourth pressure P4 to the second pressure P2, without supplying $NH_3/H_2$ gas, $N_2$ gas, and microwaves. The second pressure P2 is lower than the first pressure P1. The second pressure P2 may be 0.8 Torr (107 Pa), for example.

Then, at the time t94, the controller 70 causes the $NH_3/H_2$ gas to be supplied from the reacting gas supply 22c to the processing chamber 12, and causes the microwave to be supplied via the antenna 22a. Thus, a plasma of the $NH_3/H_2$ gas is formed in the processing chamber 12. Note that microwave power may be set at 3 kW, for example.

Then, from the time t94 to a time t95, the controller 70 causes a plurality of cycles, each of which includes a step of increasing the pressure of the processing chamber 12 and a step of decreasing the pressure of the processing chamber 12, to be repeated. During these steps, a state in which the plasma of the $NH_3/H_2$ gas is formed in the processing chamber 12, is maintained. In such a configuration, the deposited film deposited in the processing chamber 12 is removed with the formed plasma. Note that the number of cycles may be three, for example.

In the step of increasing the pressure of the processing chamber 12, the pressure of the processing chamber 12 increases in a stepped manner, from the second pressure P2 to the third pressure P3, as illustrated in the example of FIG. 9. In other words, in the step of increasing the pressure of the processing chamber 12, the pressure of the processing chamber 12 is increased each time a predetermined period of time elapses.

In the step of decreasing the pressure of the processing chamber 12, the pressure of the processing chamber 12 decreases in a stepped manner, from the third pressure P3 to the second pressure P2, as illustrated in the example of FIG. 9. In other words, in the step of decreasing the pressure of the processing chamber 12, the pressure of the processing chamber 12 is decreased each time a predetermined period of time elapses.

Note that in each of the step of increasing the pressure of the processing chamber 12 and the step of decreasing the pressure of the processing chamber 12, the pressure of the processing chamber 12 may be continuously varied. However, the pressure may be preferably varied in a stepped manner, from the viewpoint of stabilizing plasma discharge. The third pressure P3 is higher than the second pressure P2. For example, the third pressure P3 may be 3.0 Torr (400 Pa). The time period from the time t92 to the time t93 is set in accordance with a thickness of the deposited film that is deposited in the processing chamber 12. For example, such a time period may be between 30 minutes and 90 minutes.

Then, at the time t95, the controller 70 interrupts the supply of the $NH_3/H_2$ gas from the reacting gas supply 22c to the processing chamber 12, and interrupts the supply of the microwave via the antenna 22a.

Then, from the time t95 to a time t96, the controller 70 causes the pressure of the processing chamber 12 to change from the second pressure P2 to the first pressure P1, without supplying the $NH_3/H_2$ gas, the $N_2$ gas, and the microwave.

In the plasma purging illustrated in FIG. 9, the controller 70 causes the deposited film, which is deposited in the processing chamber 12, to be removed with the plasma formed from the microwave. In such a configuration, with use of the plasma of the $NH_3/H_2$ gas, the deposited film deposited in the processing chamber 12 can be purged and removed.

Further, in the plasma purging illustrated in FIG. 9, the controller 70 repeats the multiple cycles each of which includes the step of increasing the pressure of the processing chamber 12 and the step of decreasing the pressure of the processing chamber 12. During these steps, the plasma of the $NH_3/H_2$ is formed in the processing chamber 12. In such a configuration, while the plasma purging is performed, an in-plane distribution of emission intensity from the plasma of the $NH_3/H_2$ gas can be varied below the top plate 40 of the antenna 22a. For this reason, the deposition film deposited on the lower surface of the top plate 40 of the antenna 22a can be prevented from remaining in part of a lower surface area of the top plate 40. As a result, generation of particles can be prevented in the deposition process.

[Emission Intensity from Plasma]

Results of evaluation for emission intensity distribution of a plasma formed from the microwave will be described hereafter. Where, evaluation was performed using an infrared camera. In the evaluation, a target temperature of the heater 26 was 80° C., and a target temperature of the chiller 48 was 60° C. Further, a gas mixture of $NH_3$ gas, $H_2$ gas, and Ar gas was used as the purge gas, and power of the microwave was fixed at 2.5 kW. Under such a condition, the emission intensity distribution of the plasma was measured when pressure of the processing chamber 12 was varied.

Figure 10:
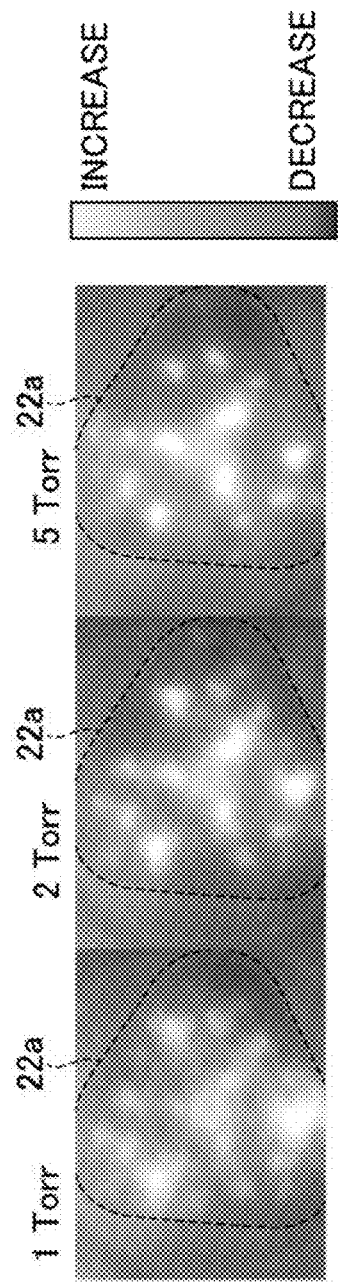
FIG. 10 is a diagram illustrating an emission intensity distribution of a plasma.

FIG. 10 is a diagram illustrating the emission intensity distribution of the plasma, and illustrates the emission intensity distribution of the plasma in surfaces of a given antenna 22a. A left-side diagram in FIG. 10 illustrates the result when pressure of the processing chamber 12 was 1 Torr (133 Pa). A middle diagram in FIG. 10 illustrates the result when pressure of the processing chamber 12 was 2 Torr (267 Pa). A right-side diagram in FIG. 10 illustrates the result when pressure of the processing chamber 12 was 5 Torr (667 Pa).

As illustrated in FIG. 10, by varying the pressure of the processing chamber 12, it is found that the emission intensity distribution of the plasma of $NH_3/H_2$ gas varied in the surfaces of the antenna 22a. Specifically, it is found that, when the pressure of the processing chamber 12 decreased, the emission intensity from the plasma was increased at an outer portion of the top plate 40. In contrast, it is found that, when the pressure of the processing chamber 12 increased, the emission intensity from the plasma was increased at a middle portion of the top plate 40.

From the results illustrated in FIG. 10, it is confirmed that, in the state in which the plasma of $NH_3/H_2$ gas was formed in the processing chamber 12, in-plane distribution for emission intensity from the plasma could be varied in accordance with variation in the pressure of the processing chamber 12.

[Particle Evaluation]

First, in a state in which a deposition film was deposited in the processing chamber 12, a given wafer was accommodated in the processing chamber 12. Then, the deposition film deposited in the processing chamber 12 was removed under each of conditions A to E as described below. Further, the number of particles that were deposited on the wafer during a given process, was measured.

(Condition A)

Target temperature of chiller 48: 80° C.
Pressure of processing chamber 12: 0.4 Torr (53 Pa)
Microwave power: 3.0 kW
Purge gas: a-1/a-2/a-3=$N_2/N_2/N_2$
Time period for purging: 60 minutes
Target temperature of heater 26: 550° C.

Note that a-1, a-2, and a-3 represent respective regions in which the antennas 22a-1, 22a-1, and 22a-3 are provided, and each region is within the second region R2. Where, a-1/a-2/a-3=$N_2/N_2/N_2$ means that $N_2$ gas is supplied to the region where the antenna 22a-1 is provided, $N_2$ gas is supplied to the region where the antenna 22a-2 is provided, and N$_2$ gas is supplied to the region where the antenna 22a-3 is provided.
(Condition B)
Target temperature of chiller 48: 80° C.
Pressure of processing chamber 12: 2.0 Torr (267 Pa)
Microwave power: 3.0 kW
Purge gas: a-1/a-2/a-3=H$_2$/H$_2$/H$_2$+NH$_3$
Time period for purging: 60 minutes
Target temperature of heater 26: 550° C.
(Condition C)
Target temperature of chiller 48: 80° C.
Pressure of processing chamber 12: 0.9 Torr (120 Pa)
Microwave power: 3.0 kW
Purge gas: a-1/a-2/a-3=H$_2$/H$_2$/H$_2$+NH$_3$
Time period of purging: 60 minutes
Target temperature of heater 26: 550° C.
(Condition D)
Target temperature of chiller 48: 80° C.
Pressure of processing chamber 12: multiple cycles each of which includes a step of increasing pressure in a stepped manner, from 0.8 Torr (107 Pa) to 3.0 Torr (400 Pa); and a step of decreasing pressure in a stepped manner, from 3.0 Torr (400 Pa) to 0.8 Torr (107 Pa)
Microwave power: 3.0 kW
Purge gas: a-1/a-2/a-3=H$_2$/H$_2$/H$_2$+NH$_3$
Time period for purging: 60 minutes
Target temperature of heater 26: 550° C.
(Condition E)
Condition D was set after condition A.

Figure 11:
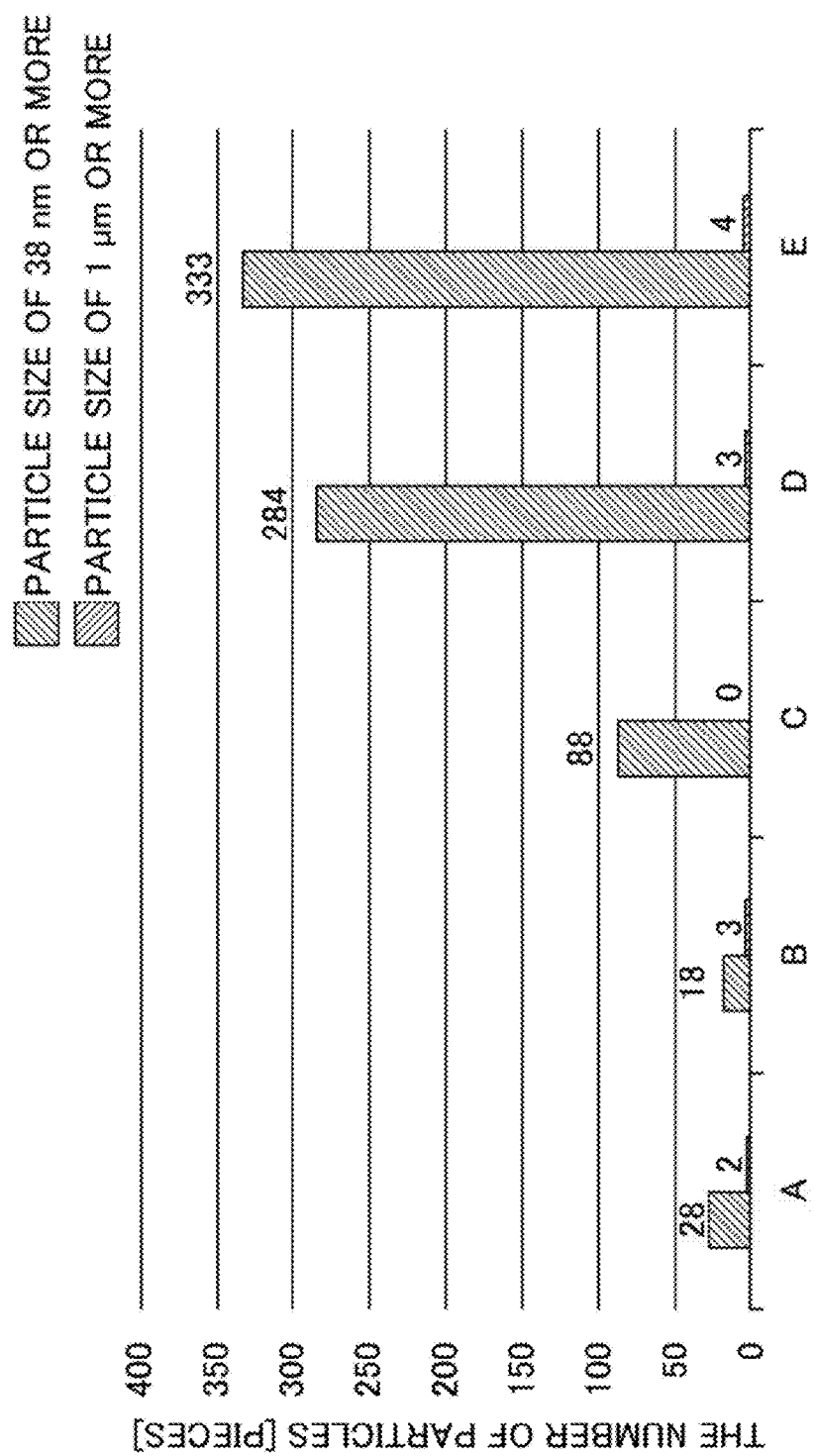
FIG. 11 is a diagram illustrating an example of evaluation results for the number of particles.

FIG. 11 is a diagram illustrating an example of evaluation results for the number of particles. FIG. 11 illustrates the results in which, after a process of removing the deposited film deposited in the processing chamber 12 was performed under each of conditions A to E, the number of particles that were deposited on a given wafer was measured. Note that FIG. 11 illustrates the number of particles each having a particle size of 38 nm or more, as well as the number of particles each having a particle size of 1 µm or more.

As illustrated in FIG. 11, for the number of particles each having the particle size of 38 nm or more; 28 under condition A; 18 under condition B; 88 under condition C; 284 under condition D; and 333 under condition E, were measured.

From the results, it is assumed that for conditions D and E each including the step of varying the pressure of the processing chamber 12 in the state in which the plasma of the purge gas was formed in the processing chamber 12, an effect of removing the deposited film deposited in the processing chamber 12 was increased in comparison to the effect under conditions A to C without including the step of varying the pressure.

Further, the following measurement was performed. Specifically, before the plasma purging was performed (plasma purging was not performed), as a reference condition, a given wafer was accommodated in the processing chamber 12 and then the deposition process was performed. Then, the number of particles that were deposited on the wafer in the deposition process, was measured. Additionally, under each of conditions A to E, after the process of removing the deposited film, a given wafer was accommodated in the processing chamber 12 and then the deposition process was performed. Then, the number of particles that were deposited on the wafer in the deposition process, was measured.

FIG. 12 illustrates another example of the evaluation results of the number of particles for the measurement described above. In FIG. 12, each evaluation result indicates the number of particles that were deposited on a given wafer. FIG. 12 indicates the evaluation result in which, before the plasma purging was performed (plasma purging was not performed), a given wafer was accommodated in the processing chamber 12, the deposition process was performed, and then the number of particles deposited on the wafer in the deposition process was measured. Further, FIG. 12 indicates the evaluation result in which, after the process of removing the deposited film under each of conditions A to E, a given wafer was accommodated in the processing chamber 12, the deposition process was performed, and then the number of particles deposited on the wafer in the deposition process was measured. Note that FIG. 12 illustrates the number of particles each having a particle size of 38 nm or more, as well as the number of particles each having a particle size of 1 µm or more.

Under the condition in which plasma purging was not performed, for the number of particles each having a particle size of 38 nm or more, 22 in a first run (Run-1); 44 in a second run (Run-2); 28 in a third run (Run-3); and 28 in a fourth run (Run-4), were measured. Further, under the condition in which plasma purging was not performed, for the number of particles each having a particle diameter of 1 µm or more, 2 in the first run (Run-1); 17 in the second run (Run-2); 1 in the third run (Run-3); and 5 in the fourth run (Run-4), were measured.

Under condition A, for the number of particles each having a particle size of 38 nm or more, 17 in a first run (Run-1); 24 in a second run (Run-2); and 13 in a third run (Run-3), were measured. Further, under condition A, for the number of particles each having a particle size of 1 µm or more, 2 in the first run (Run-1); 0 in the second run (Run-2); and 0 in the third run (Run-3), were measured.

Under condition B, for the number of particles each having a particle size of 38 nm or more, 306 in a first run (Run-1); 27 in a second run (Run-2); and 6 in a third run (Run-3), were measured. Further, under condition B, for the number of particles each having a particle size of 1 µm or more, 7 in the first run (Run-1); 2 in the second run (Run-2); and 0 in the third run (Run-3), were measured.

Under condition C, for the number of particles each having a particle size of 38 nm or more, 11 in a first run (Run-1); 7 in a second run (Run-2); and 27 in a third run (Run-3), were measured. Further, under condition C, for the number of particles each having a particle size of 1 µm or more, 3 in the first run (Run-1); 1 in the second run (Run-2); and 6 in the third run (Run-3), were measured.

Under condition D, for the number of particles each having a particle size of 38 nm or more, 4 in a first run (Run-1); 7 in a second run (Run-2); 2 in a third run (Run-3); and 4 in a fourth run, were measured. Further, under condition D, for the number of particles each having a particle size of 1 µm or more, 0 in the first run (Run-1); 0 in the second run (Run-2); 0 in the third run (Run-3); and 0 in the fourth run, were measured.

Under condition E, for the number of particles each having a particle size of 38 nm or more, 1 in a first run (Run-1); 2 in a second run (Run-2); 10 in a third run (Run-3); and 1 in a fourth run, were measured. Further, under the condition E, for the number of particles each having a particle size of 1 µm or more, 0 in the first run (Run-1); 0 in the second run (Run-2); 2 in the third run (Run-3); and 0 in the fourth run, were measured.

From the results, it is confirmed that, under the conditions D and E each including the step of varying the pressure of the processing chamber 12 in the state in which the plasma of the purge gas was formed in the processing chamber 12, particles could be prevented from being generated in the deposition process, in comparison to the conditions A to C without including the step of varying the pressure.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

The above embodiments have been described using a semi-batch device in which the deposition apparatus allows multiple substrates disposed on the stage in the processing chamber to rotate using the stage, and causes the substrates to pass the first region and the second region in sequence, so that the substrates are processed. However, the present disclosure is not limited to the semi-batch device. For example, the deposition apparatus may be a single substrate processing device that performs processing for each one substrate. Also, for example, the deposition apparatus may be a batch device that processes multiple substrates at a time.

In the above embodiments, an apparatus is used in which the deposition apparatus forms the plasma by supplying the microwave via the antennas. However, the present disclosure is not limited to the above apparatus. For example, the deposition apparatus may be an apparatus using an inductively coupled plasma (ICP).

According to the present disclosure, generation of particles in a deposition process can be suppressed.

What is claimed is:

1. A processing method comprising:
    varying pressure of a processing chamber in a state in which a plasma of a purge gas is formed in the processing chamber, the varying including
        removing a film deposited in the processing chamber, with the formed plasma,
        increasing the pressure of the processing chamber to a first pressure level by increasing the pressure in a stepwise manner with a plurality of step increases which are repeated at intervals equal to a first time period, and
        decreasing the pressure of the processing chamber from the first pressure level to a second pressure level by decreasing the pressure in a stepwise manner with a plurality of step decreases which are repeated at intervals equal to a second time period.

2. The processing method according to claim 1, wherein the increasing of the pressure to the first pressure level and the decreasing of the pressure to the second level pressure occur repeatedly.

3. The processing method according to claim 1, wherein varying pressure occurs in a state in which a substrate is accommodated in the processing chamber.

4. The processing method according to claim 1, wherein varying pressure occurs in a state in which a substrate is not accommodated in the processing chamber.

5. The processing method according to claim 1, wherein the purge gas includes $H_2$ gas.

6. The processing method according to claim 1, wherein the purge gas includes $NH_3$ gas.

7. The processing method according to claim 1, wherein the plasma is formed by supplying a microwave from an antenna.

8. The processing method according to claim 7, comprising performing a deposition process in a state in which a substrate is accommodated in the processing chamber,
    wherein the antenna includes a top plate, and wherein varying pressure occurs such that a temperature of the top plate is higher than that of the top plate in performing a deposition process.

9. The processing method according to claim 1, comprising forming a plasma of a second purge gas in the processing chamber, the forming including removing the film deposited in the processing chamber, with the formed plasma of the second purge gas.

10. The processing method according to claim 9, wherein forming a plasma of a second purge gas occurs in a state in which the pressure of the processing chamber is constantly maintained.

11. The processing method according to claim 9, wherein forming a plasma of a second purge gas occurs before varying pressure.

12. The processing method according to claim 9, wherein in forming a plasma of a second purge gas, the pressure of the processing chamber is less than a minimum value for the pressure of the processing chamber in varying pressure.

13. The processing method according to claim 9, wherein the second purge gas includes $N_2$ gas.

* * * * *